United States Patent [19]
Deconinck

[11] Patent Number: 6,030,897
[45] Date of Patent: Feb. 29, 2000

[54] METHOD OF FORMING AN ALIGNMENT MARK WITHOUT A SPECIFIC PHOTOLITHOGRAPHIC STEP

[75] Inventor: Pascal Deconinck, Boissise-le-Roi, France

[73] Assignee: International Business Machines Corporation, Armonk, N.Y.

[21] Appl. No.: 09/085,790

[22] Filed: May 28, 1998

[30] Foreign Application Priority Data

Jul. 15, 1997 [EP] European Pat. Off. ............. 97480042

[51] Int. Cl.$^7$ ................................................. H01L 21/302
[52] U.S. Cl. .......................... 438/691; 438/694; 438/975
[58] Field of Search .................................. 438/691, 692, 438/697, 712, 700, 701, 702, 975, 401, 427

[56] References Cited

U.S. PATENT DOCUMENTS

| | | | |
|---|---|---|---|
| 5,470,782 | 11/1995 | Schwalke et al. | 437/70 |
| 5,733,801 | 3/1998 | Gojohbori | 437/228 |
| 5,786,260 | 7/1998 | Jang et al. | 438/401 |
| 5,893,744 | 4/1999 | Wang | 438/401 |
| 6,738,961 | 4/1998 | Chen | 430/22 |

*Primary Examiner*—Benjamin Utech
*Assistant Examiner*—Kin-Chan Chen
*Attorney, Agent, or Firm*—Stevn Capella

[57] ABSTRACT

An alignment mark is formed in a planar semiconductor IC structure coated by a layer opaque to the radiations of the photo-stepper used to perform a photolithographic step. First, there is provided a structure comprised of a silicon substrate (11) having at least one shallow isolation trench (17A) in the chip region (13) and one shallow alignment trench (17B') in the kerf region (14) of the substrate wherein said alignment trench has a determined width (W'). Then, a layer (18) of an insulating material is conformally deposited onto the structure. Its thickness is adequate to over fill the trenches so that depressions (18A, 18B') are created above the locations of said isolation and alignment trenches. Next, the structure is planarized by filling the depression over said isolation trench but not the depression (18B') formed over said alignment trench to preserve it. Now, the structure is uniformly etched back down to the surface of the silicon substrate transferring thereby said depression in the insulating material filling the alignment trench creating thereby a recess (22'). Finally, a layer (23) of an opaque material is conformally deposited onto the structure, which in turn produces a new depression (23B'). Said width W' is determined to have the alignment mark (22' or 23B') of the adequate size to perform the said photolithographic step.

9 Claims, 10 Drawing Sheets

PRIOR ART    13 (CHIP)    14 (KERF)

PRIOR ART    13 (CHIP)    14 (KERF)

PRIOR ART    13 (CHIP)    14 (KERF)

METHOD OF FORMING AN ALIGNMENT MARK WITHOUT A SPECIFIC PHOTOLITHOGRAPHIC STEP

FIELD OF INVENTION

The present invention relates to the manufacture of semiconductor integrated circuits and more particularly to an improved method of forming an alignment mark without a specific photolithographic step. The disclosed method allows an accurate alignment of a photomask on a planarized semiconductor integrated circuit structure even it is coated by at least one layer of an opaque material such as tungsten. The alignment marks that are necessary to a proper registration of the photomask with respect to the wafer at a lithographic stage, are now defined without necessitating a specific photolithographic step.

BACKGROUND OF THE INVENTION

In the advanced semi-conductor integrated circuits (IC) technology to date, planarization of the structure topology is required at different steps of the fabrication process in order to achieve the desired high density of circuits to be integrated in the chip. This high density of circuits is obtained by miniaturizing the elementary devices such as transistors. Attaining the desired minimal device dimensions requires a high lateral resolution at the photolithographic levels which can only be obtained with a short depth of focus. This is the reason why it is absolutely necessary to planarize the structure before every photolithographic step.

Unfortunately, the planarization makes difficult the alignment of the photomask at a determined level on the previous levels because a plane surface causes a poor visibility of alignment marks and this alignment becomes even an impossible task when the chip has been coated with a layer of a poorly transparent (or in some instances a totally opaque) material. Because, opaque materials such as tungsten, tungsten silicide, polysilicon and TEOS $SiO_2$ in some extent, are more and more used in planarized structures, this problem of accurate photomask alignment is considered to be very serious.

At present, the alignment problem is generally overcome by introducing an additional photolithographic step in the fabrication process after the planarization has been completed. The aim is to destroy the planarization in a specific region of the wafer, to create an alignment mark or a topology that has the desired visibility to perform the photomask alignment. Unfortunately, this is achieved at the cost of two extra steps: a photolithographic step and an etch step. This known solution to this problem of lack of visibility of alignment marks will be briefly described hereunder by reference to FIG. 1 and FIGS. 2A to 2L, in the particular case where very dense CMOS IGFETs isolated from one another by shallow isolation trenches are integrated in a semiconductor chip according to a conventional fabrication process.

FIG. 1 schematically illustrates a structure 10 shown as a part of a semiconductor wafer at the initial stage of this conventional fabrication process. Structure 10 consists of a silicon substrate 11 with a passivation layer 12 formed thereon. Typically, this passivation layer 12 consists of a 14.5 nm thick silicon dioxide ($SiO_2$) bottom pad layer and a 150 nm thick silicon nitride ($Si_3N_4$) pad top layer, jointly referred to hereinbelow as the $Si_3N_4$ pad layer 12 for sake of simplicity. As known for those skilled in the art, substrate 11 is comprised of two types of regions, usually referred to as the "chip" and "kerf" regions respectively, that must be clearly distinguished. The chip region 13 contains the useful circuitry, while the kerf region 14 (which encompasses the chip) includes all the test devices, alignment marks and the like that are necessary to the fabrication of the circuit devices of the chip. The kerf region is destroyed when the wafer is diced in chips by a diamond saw.

Now, the shallow isolation trenches have to be delineated in the substrate 11. First, the structure of FIG. 1 is coated with a layer 15 of a photosensitive material such as a photoresist. After deposition, the photoresist layer 15 is exposed, then baked and developed as standard to leave a patterned layer, also referred to as the IT mask. In essence, the purpose of this masking layer, referenced 15 in FIG. 2A, is to define the locations, e.g. 16A, of the shallow isolation trenches to be formed at the main surface of the silicon substrate 11 in the chip region 13. However, as apparent in FIG. 2A, a specific pattern 16B is made above the kerf region 14. The role of pattern 16B is to define alignment trenches.

The process continues with the IT etch. The wafer is placed in a plasma etcher and an anisotropic RIE etch is performed to transfer the pattern of masking layer 15 in the silicon substrate 11 through the $Si_3N_4$ pad layer 12. As apparent from FIG. 2B, a shallow isolation trench 17A (that is relatively wide) and a shallow alignment trench 17B (that has a narrow profile) are formed in substrate 11. Typically, the shallow trench depth is about 600 nm.

The alignment trench 17B that will be subsequently used to define an alignment mark has dimensions consistent with the specifications of photo-steppers that are used at the photolithographic level in consideration. For instance, with the photo-steppers NSR/MCSV manufactured by NIKON Corp. Tokyo, Japan, the alignment mark consists of three rows of 3 $\mu$m wide square-shaped recesses separated one from another by 6 82 m, and in this case, the alignment trench width W is in the 1–3 $\mu$m range. Next, the remaining portions of masking layer 15 are removed, for instance by ashing in an equipment such as model 200 AC II sold by FUSION SEMICONDUCTOR SYSTEMS, Phoenix, Ariz., USA. The structure 10 at this stage of the process is shown in FIG. 2B.

The next step consists in thermally growing a thin $SiO_2$ layer (not shown) on the portions of the surfaces of the substrate that are not protected by the remaining portions of the $Si_3N_4$ pad layer 12. Then, the shallow trenches 17A and 17B are filled with TEOS $SiO_2$. To that end, a layer 18 of TEOS $SiO_2$ having a thickness Th1 of about 700 nm is conformally deposited, generally by LPCVD or PECVD, onto the structure 10. It has therefore the adequate thickness to overfill (by about 100 nm) the shallow trenches as apparent from FIG. 2C. A wide depression 18A above isolation trench 17A and a small depression 18B above alignment trench 17B are created as it may be noticed in FIG. 2C. At this stage of the fabrication, the structure 10 must be planarized and the initial thickness of the TEOS $SiO_2$ layer 18 must be reduced down to the surface of the $Si_3N_4$ pad layer 12.

In reality, the planarization process is comprised of two main processing steps. The first main step comprises the successive deposition of two photoresist layers. A first 700 nm thick layer 19 is deposited onto the structure, then exposed, baked and developed as standard to leave a patterned layer referred to as the AB1 mask still referenced 19. Now turning to FIG. 2D, the AB1 mask 19 is comprised of parts 19A and 19B (blackened), which aims to fill the depressions 18A and 18B above the trenches 17A and 17B respectively.

The structure 10 is then heated to a temperature sufficient to cause the photoresist material of said parts 19A and 19B to flow and completely fill the depressions 18A and 18B for a coarse planarization. Next, a second 700 nm thick layer 20 of the same photo-resist is applied over the structure 10 to form the AB2 mask and baked. After this second step, we can consider that the wafer surface is substantially planar. At this stage of the process, the structure 10 is shown in FIG. 2E.

The planar surface of the FIG. 2E structure will be transferred to the TEOS $SiO_2$ layer 18 to produce a thinner but still planar surface (except some TEOS $SiO_2$ pits also referred to as "fences") all over silicon substrate 11. The wafer is placed in a plasma etcher such as an AME 5000 manufactured by Applied Materials Inc., Santa Clara, Calif., USA and is etched with a $CHF_3/NF_3$ mixture. The top resist layer 20 and in some extent, the surface of the remaining portions of mask 19 as well, are etched until the surface of the TEOS $SiO_2$ layer 18 (at mount locations) is reached. However, a slight overetching is performed at this stage of the process. The resulting structure is shown in FIG. 2F.

In the same plasma etcher, but with a different $CHF_3/NF_3$ gas ratio, the remaining portions of AB1 mask 19 and the TEOS $SiO_2$ layer 18 are etched at substantially the same rate. Next, the TEOS $SiO_2$ material is etched, still in the same plasma etcher, but with a $CHF_3/CO_2$ mixture that etches the TEOS $SiO_2$ material of layer 18 much faster than the photoresist of AB1 mask 19. At this stage of the fabrication, the structure 10 is shown in FIG. 2G.

The remaining portions of the AB1 mask 19 are then eliminated. After photoresist stripping, the resulting structure 10 is shown in FIG. 2H. As apparent from FIG. 2H, due to different etch rates and anisotropic conditions, peak-shaped TEOS $SiO_2$ fences remain at the surface of the structure 10 that are referenced 18A above the shallow trench 17A in the chip region and 18B above the shallow trench 17B in the kerf region.

According to the second main step, a chemical-mechanical (chem-mech) polishing of the structure 10 now is performed. During this step, the TEOS $SiO_2$ layer 18 remaining over the $Si_3N_4$ pads 12 is eliminated. To that end, the structure 10 is first polished until the surface of the $Si_3N_4$ pad layer 12 is reached and the polishing is continued for a slight overpolishing for complete removal of the TEOS $SiO_2$ material except in the shallow trenches 17A and 17B as apparent from FIG. 2I. At this stage of the fabrication, the structure 10 surface is perfectly planar. This terminates the planarization process.

In the following step, the surface of the chip region is protected by a layer of photoresist. After exposition, bake and development, this layer of photoresist forms a block-out mask referenced 21 in FIG. 2J over the whole surface of the chip except above the shallow alignment trench 17B in the kerf region. Then, the TEOS $SiO_2$ material filling trench 17B is removed by wet etching in a buffered HF bath to produce a recess referenced 22. It is not necessary to completely remove the TEOS $SiO_2$ material in the trench 17B, a partial etch may be satisfactory as far as a step forming recess is created.

Next, the block-out mask 21 is stripped by ashing as standard. The remaining portions of the $Si_3N_4$ pad layer 12 are then eliminated by wet etching in a hot $H_3PO_4$ bath that has a high TEOS $SiO_2/Si_3N_4$ selectivity. In turn, the underlying 14.5 nm thick $SiO_2$ layer is removed by dipping structure 10 in a buffered HF solution. At this stage of the fabrication, the structure 10 is shown in FIG. 2K.

A thin (10 nm) layer of $SiO_2$ is then thermally grown on the exposed regions of silicon substrate 11 to form the gate dielectric regions of the IGFETs. Finally, the gate electrodes of said IGFETs are formed above the gate dielectric regions. To that end, a 230 nm thick layer of polysilicon, a 230 nm thick layer of tungsten silicide ($WSi_x$) and a 200 nm thick layer of TEOS $SiO_2$ are successively blanket deposited onto the FIG. 2K structure. All these layers are represented by a single layer referenced 23 in FIG. 2L. The small depression referenced 23B that can be noticed above alignment trench 17B in FIG. 2L is of paramount importance, because it will be subsequently used as an alignment mark for the photolithographic step that will delineate the gate electrodes in layer 23 at the locations of the gate dielectric regions. The process continues in the other sectors of the manufacturing line until the complete fabrication of the devices composing the chips.

As clear from the above description, defining the gate electrodes over a planar surface coated with a stack of layers wherein at least one of the materials forming the composite layer 23 is opaque requires both a specific photolithographic step and an etching step to define an alignment mark in the kerf region (in this instance depression 23B). A photolithographic step implies the sub-steps of: depositing a layer of photoresist, baking, exposing the layer through a photomask to form a masking layer having the desired pattern to expose the alignment trench, etching the TEOS $SiO_2$ material filling the alignment trench and finally stripping the masking layer of photoresist.

SUMMARY OF THE INVENTION

It is therefore a primary object of the present invention to provide a method of forming an alignment mark for planar semiconductor IC structures that have a poor visibility for the photo-stepper at the lithographic stage of the wafer fabrication process which method does not require any specific photolithographic and etching steps.

It is another object of the present invention to provide a method of forming an alignment mark for planar semiconductor IC structures that are moreover coated with an opaque layer which method does not require any specific photolithographic and wet etching steps.

It is still another object of the present invention to provide a method of forming an alignment mark for planar semiconductor IC structures that is less complex and cheaper than the known techniques.

According to the present invention, there is disclosed a method of forming an alignment mark in a planar semiconductor IC structure to be used in a subsequent photolithographic step comprising the steps of:

a) providing a structure comprised of a semiconductor substrate having at least one shallow trench in a first region and one shallow alignment trench in a second region of the substrate; said alignment trench having a determined width W'; said width is such as a depression above the alignment trench will exist whatever the number and the thickness of the layers deposited onto the structure before the said photolithographic step;

b) conformally depositing a layer of a material with a thickness Th1 onto the structure adequate to overfill the trenches so that depressions are created above the locations of said trenches;

c) planarizing the structure with a planarizing medium to fill the depression over the trench formed in the first region but not the depression formed over said alignment trench to preserve it; and, d) uniformly etching back the structure down to the surface of the substrate to transfer only said depression formed above the alignment trench in the said material creating thereby a recess therein that can be used as an alignment mark for said photolithographic step.

When at this stage of the fabrication process prior to said photolithographic step, the structure is to be coated by a layer that is opaque to the radiations of the photo-stepper, the said method further comprises the step of:

e) conformally depositing a layer of an opaque material onto the structure, which in turn, produces a new depression above said recess formed in the alignment trench that will be used as an alignment mark to pattern said opaque layer during said photolithographic step.

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

DESCRIPTION OF A PREFERRED EMBODIMENT

Figure 1:
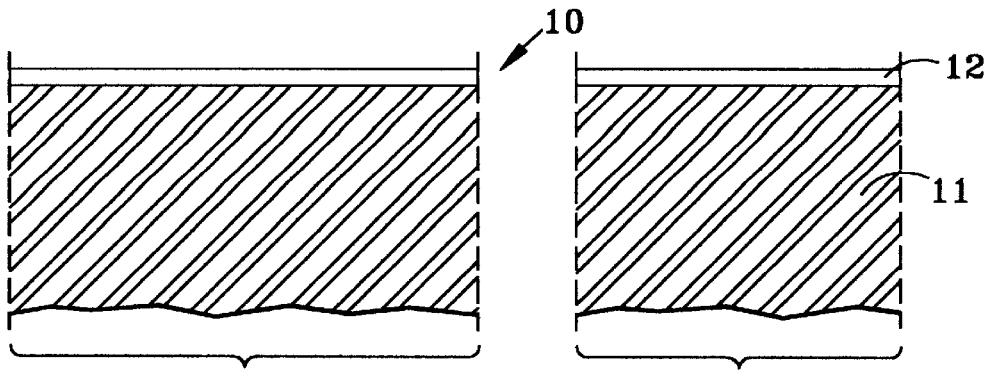
FIG. 1 shows a schematic cross section of a semiconductor structure consisting of a silicon substrate having a passivation layer formed thereon wherein the "chip" and "kerf" regions are clearly distinguished.

The method of the present invention will be described by reference to FIGS. 3A, 3B, 3C, 3D, 3E, 3F, 3G, 3H, 3I, 3J, and 3K. In essence, there is no significant change with regards to the processing steps of the conventional fabrication process described above, only the design of two photomasks will be changed according to the present invention. The starting structure still remains structure 10 shown in FIG. 1 but it will now be referred to as structure 10' to take in account these design changes. As another consequence, in FIGS. 3A to 3K, the same elements will bear the same references.

Figure 2A:
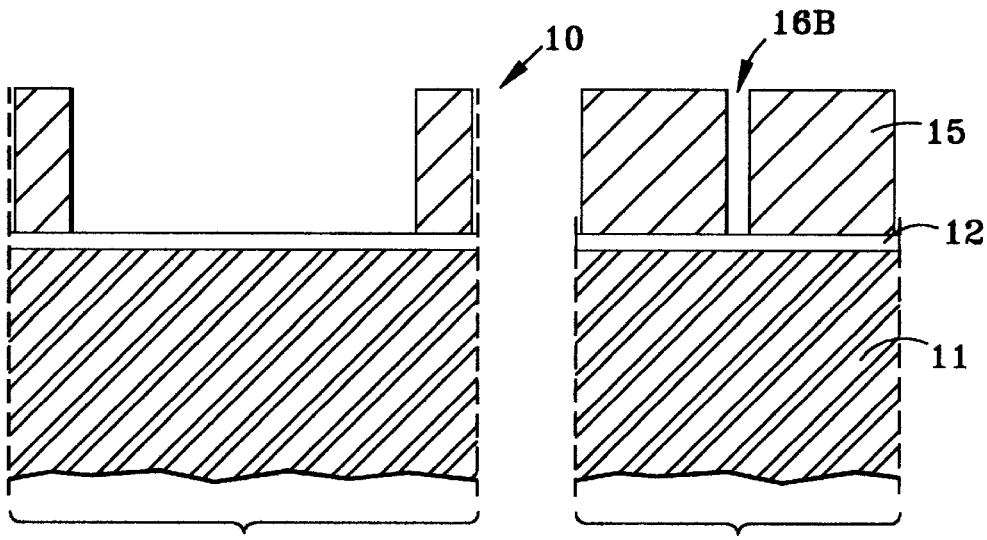
FIGS. 2A, 2B, 2C, 2D, 2E, 2F, 2G, 2H, 2I, 2J, 2K, and 2L shows schematic cross sections of the silicon structure of FIG. 1 through the sequence of steps of a conventional process of the prior art to fabricate shallow isolation trenches and gate conductor stacks for CMOS IGFETs which mandatorily requires specific photolithographic and etching steps to define an alignment mark.
Figure 3A:
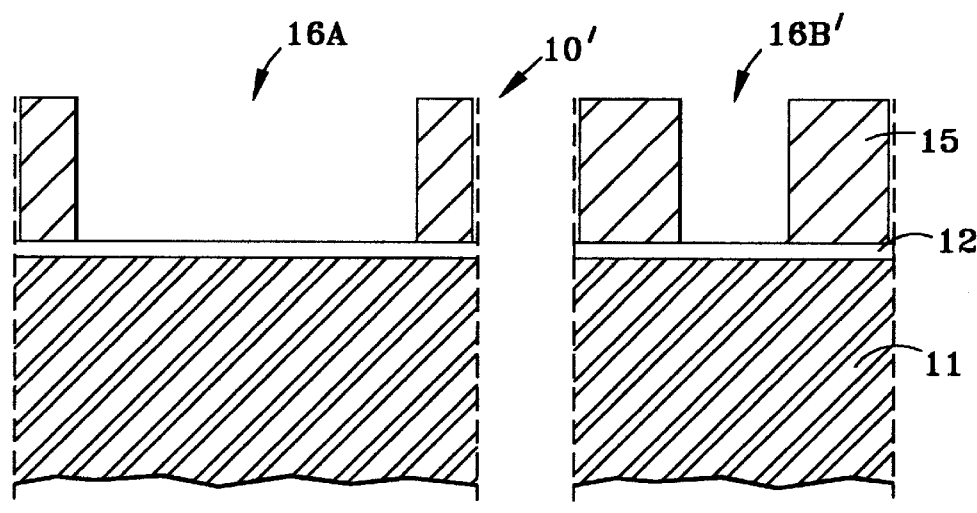
FIGS. 3A, 3B, 3C, 3D, 3E, 3F, 3G, 3H, 3I, 3J, and 3K shows cross sections of the silicon structure of FIG. 1 through the sequence of steps of fabricating shallow isolation trenches and gate conductor stacks for CMOS IGFETs according to the present invention wherein the specific photolithographic and etching steps mentioned above are no longer required to define said photolithographic step.

Now turning to FIG. 3A, the photoresist layer 15 is deposited, exposed, baked and developed the same way as described in conjunction with FIG. 2A. As apparent from FIG. 3A, the pattern which defines the alignment trench, now referenced 16B', has a different size when compared to the corresponding pattern 16B of FIG. 2A, as a result of a change in the photomask design.

Figure 3B:
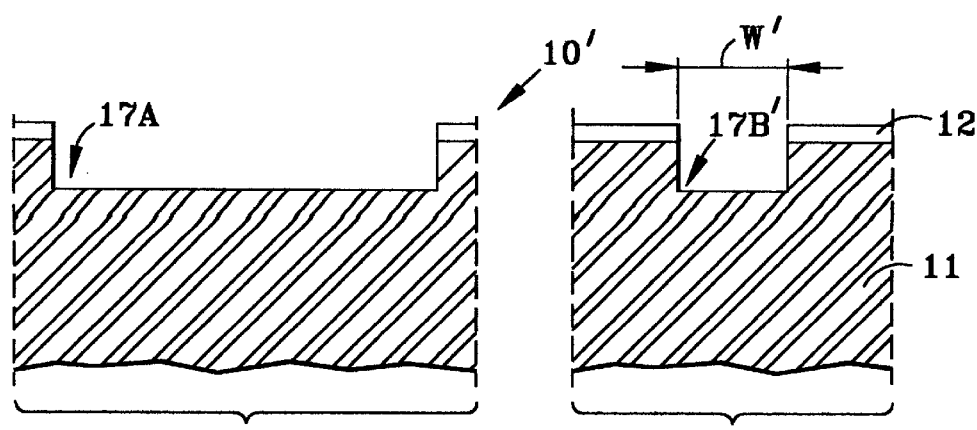

Next, the structure 10' is RIE etched to delineate the shallow trenches in the silicon substrate 11. In FIG. 3B, the alignment trench is now referenced 17B' to take in account the new design of the photomask mentioned above. The different design of the photomask used to expose the photoresist layer 15 is the only change at this stage of the fabrication process. According to an important aspect of the present invention, the width W' of the alignment trench 17B' is no longer determined by the photo-stepper specifications as it was in the prior art solution but by some parameters inherent to the wafer fabrication process. In essence, said width is such as a depression above the alignment trench will exist whatever the number and the thickness of the layers that will be deposited onto the structure before a photolithographic step takes place in the course of the fabrication process.

Figure 2B:
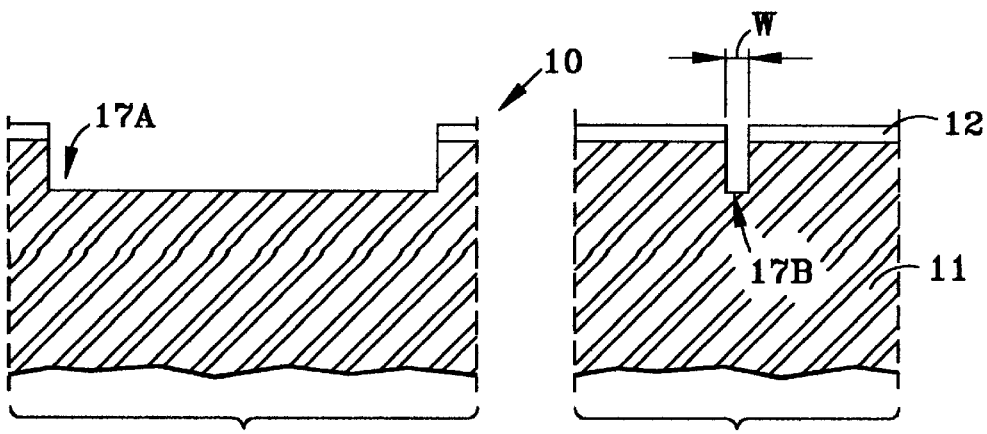
Figure 2C:
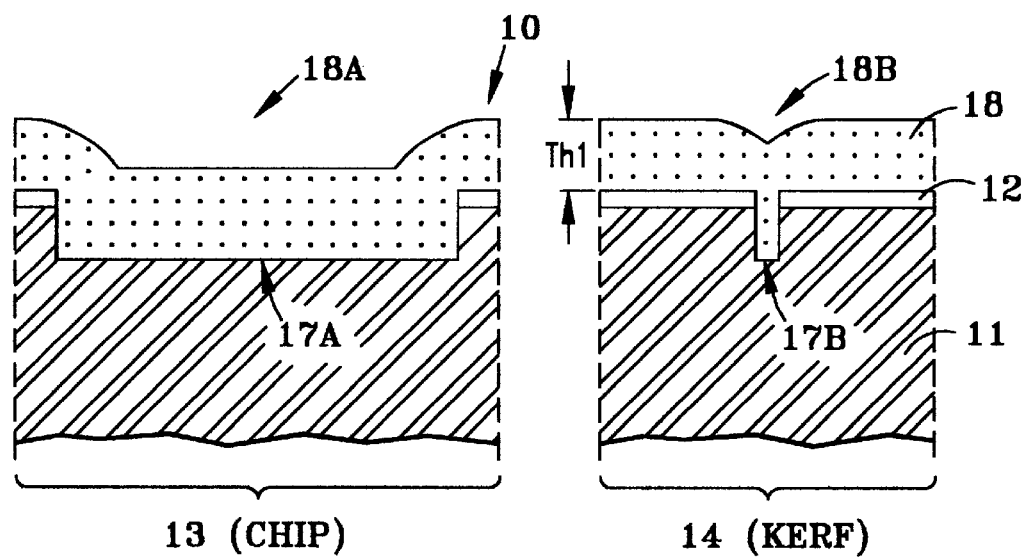
Figure 3C:
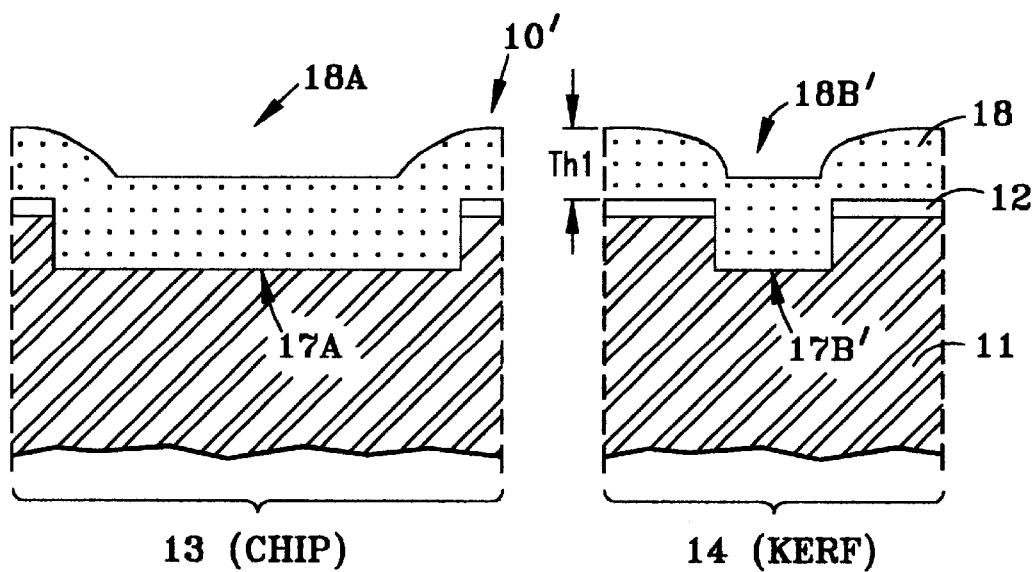
Figure 3D:
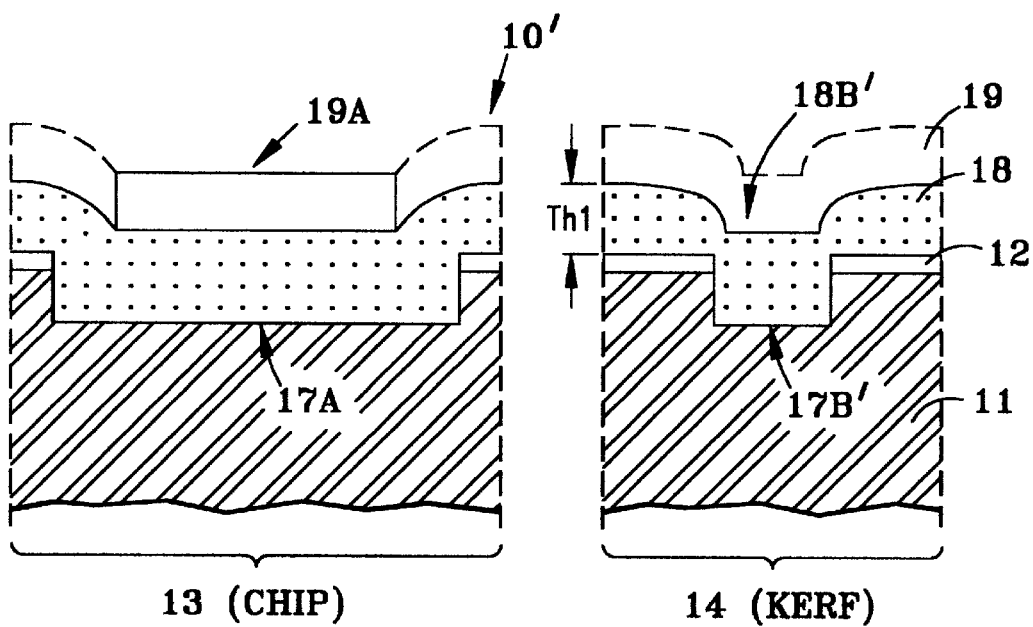
Figure 3E:
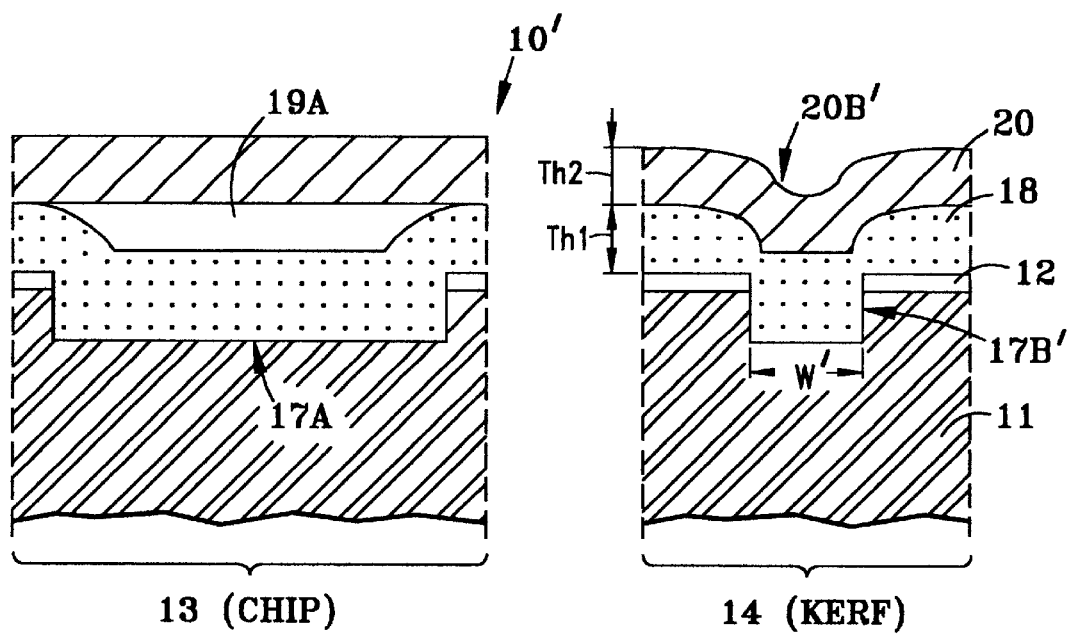

The process continues by the deposition of the TEOS $SiO_2$ layer 18 with the same thickness Th1 equal to 700 nm. The resulting structure 10' is shown in FIG. 3C. One may notice that the depression 18B' in layer 18 above alignment trench 17B' is also different when compared to the corresponding depression 18B in FIG. 2C.

Figure 2D:
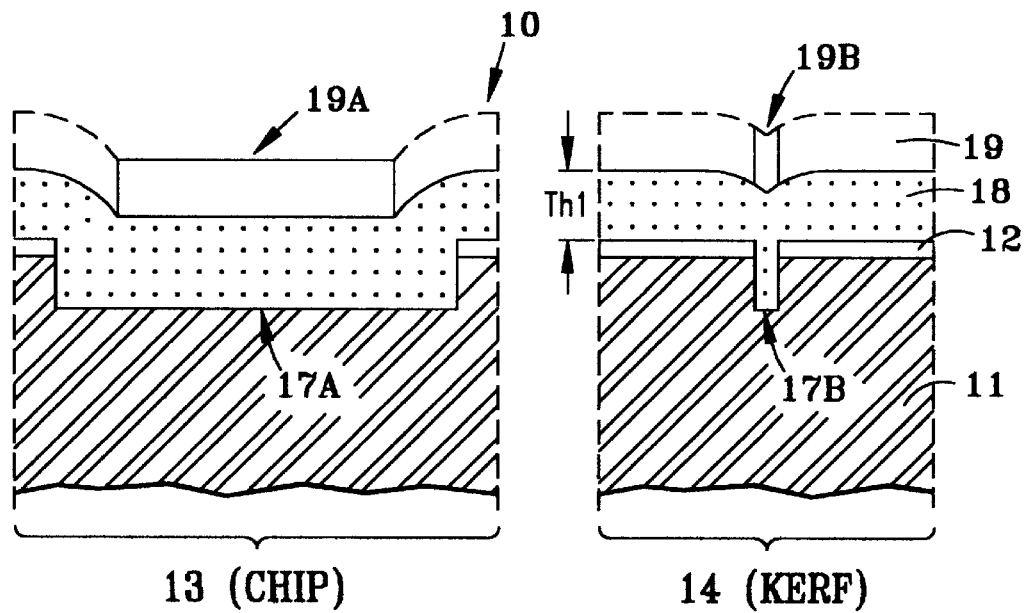
Figure 2E:
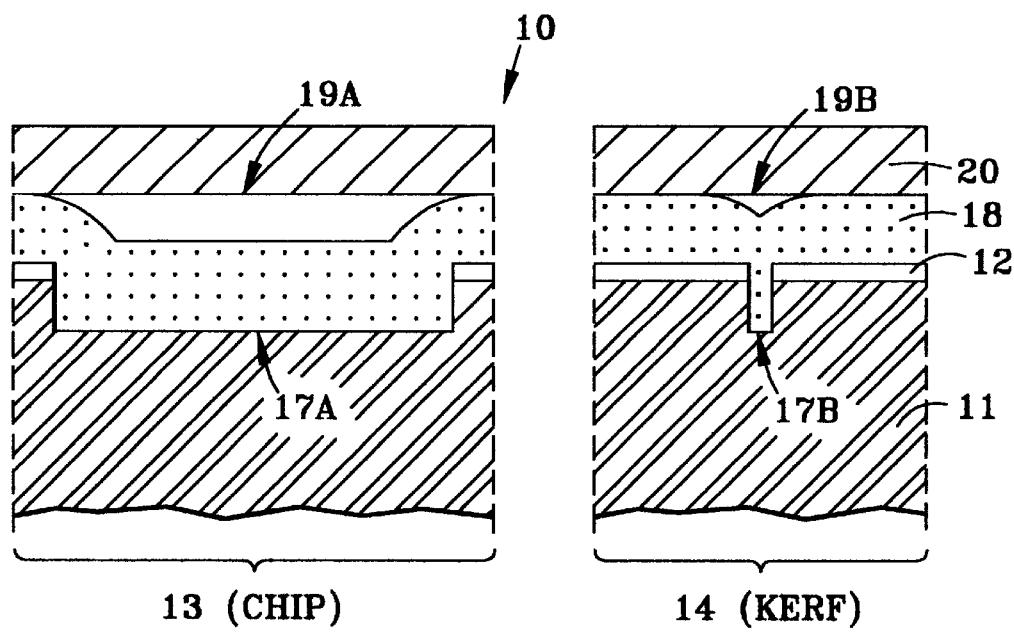
Figure 2F:
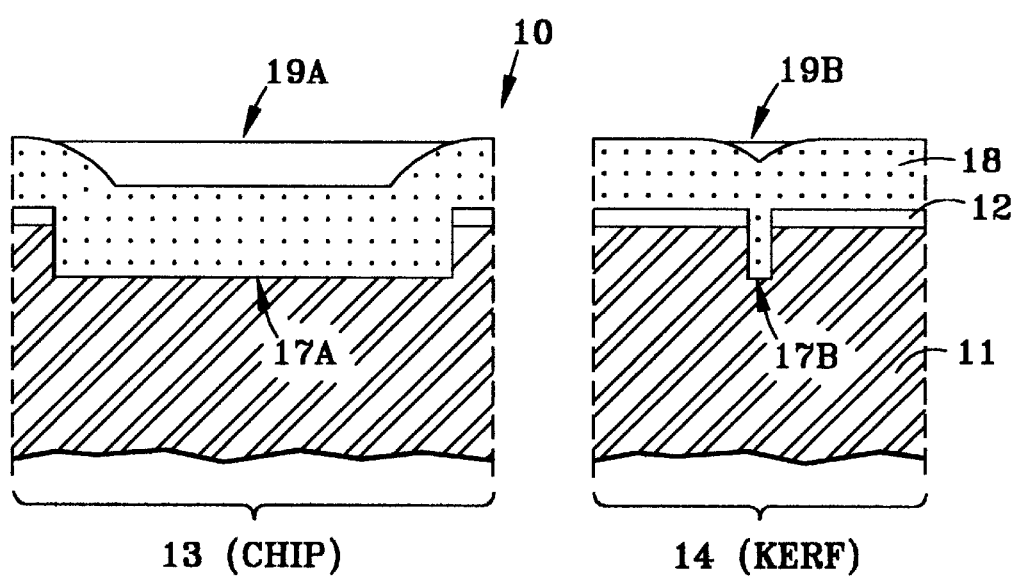
Figure 2G:
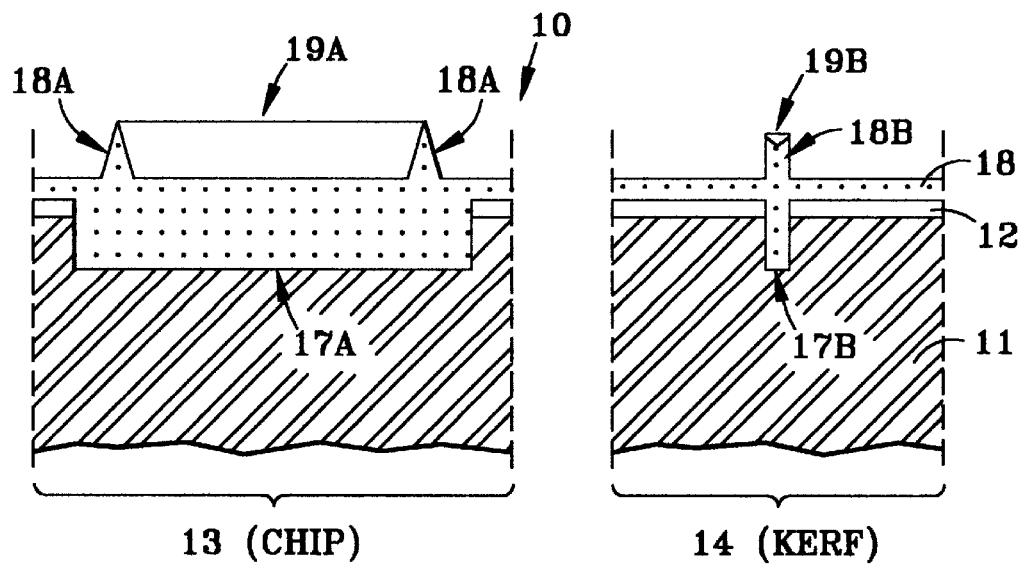
Figure 2H:
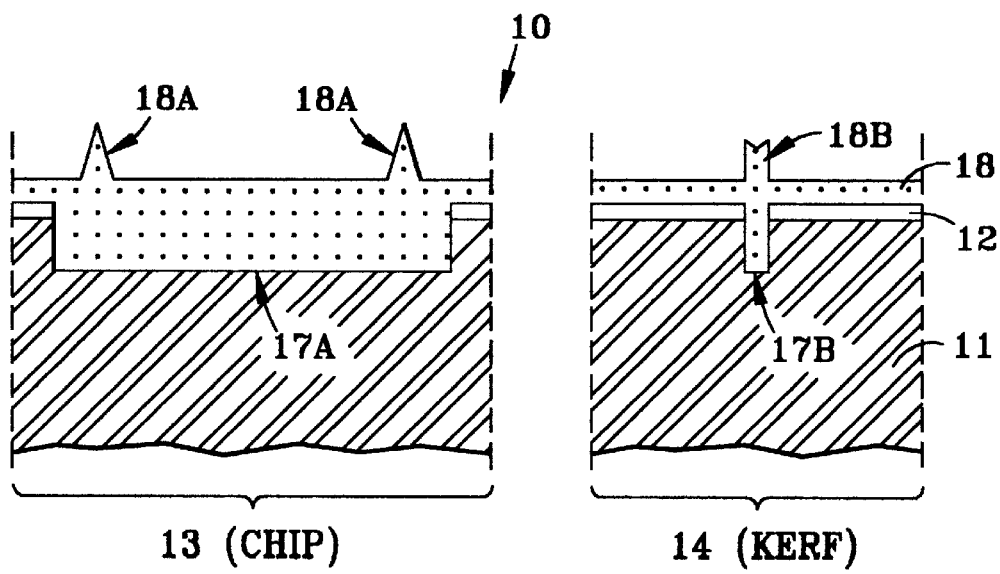
Figure 2I:
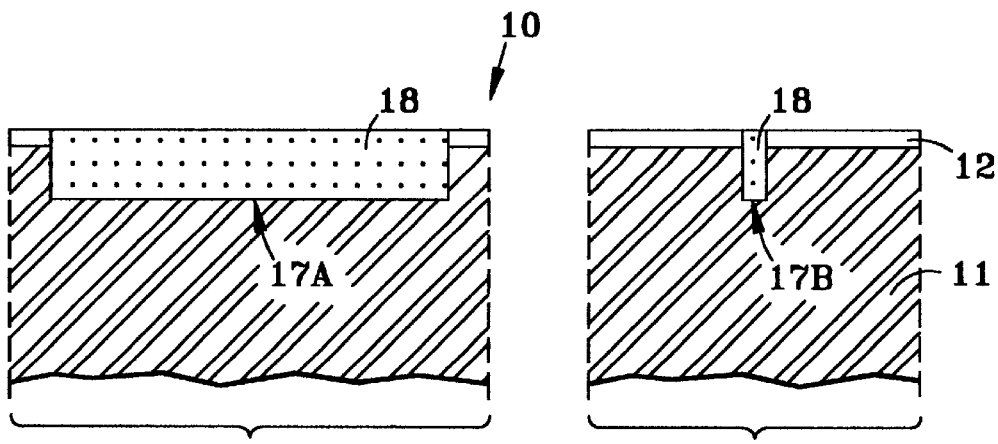
Figure 2J:
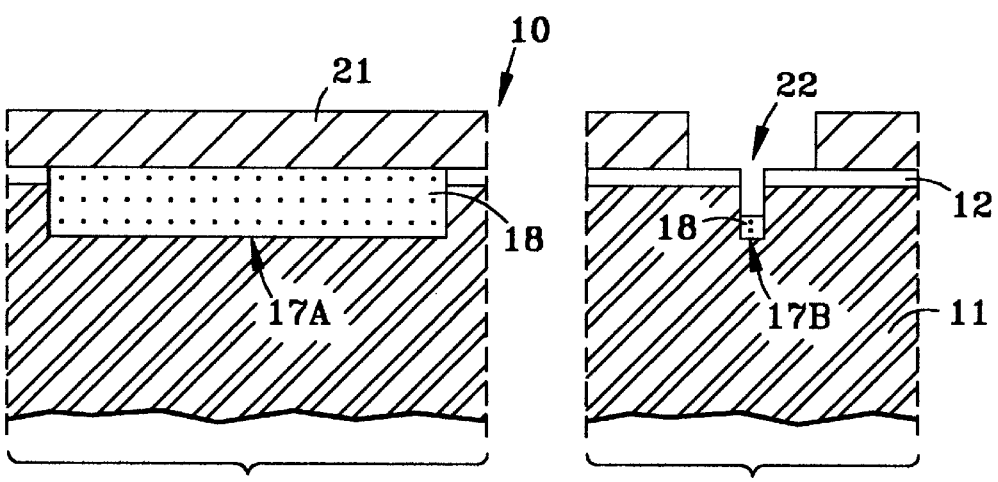
Figure 2K:
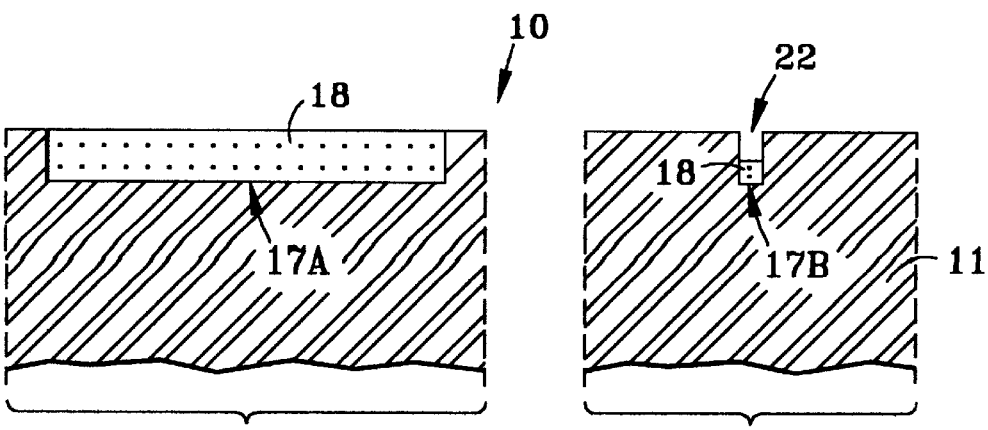
Figure 2L:
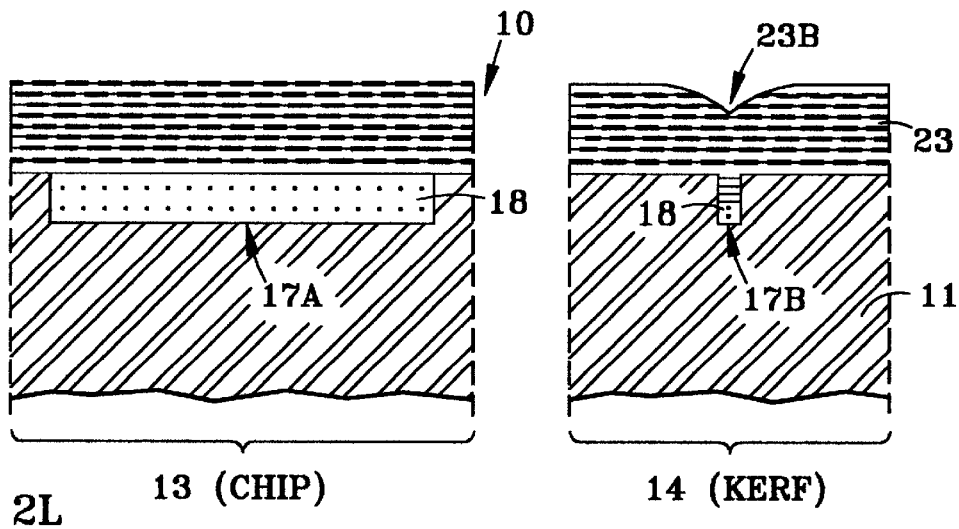

Now the photoresist layer 19 is formed. The comparison between structure 10' of FIG. 3D and structure 10 of FIG. 2D shows that at this stage of the fabrication process, the design of the photomask used to expose the photoresist layer 19 has been also modified. After exposition, bake and development, as apparent in FIG. 3D, there is no photoresist in the depression 18B' located above alignment trench 17B' (unlike above depression 18A where mask 19A is still present), so that depression 18B' is no longer masked. This additional photomask design change is another important feature of the present invention.

The structure 10' is heated to flow the photoresist of mask 19A. The second layer 20 of photoresist is then deposited onto structure 10' still as described above, but now its thickness Th2 becomes another important parameter as far as the fabrication process described by reference to FIG. 3A to 3K is implemented. The role of photoresist layer 20 is to improve the planarity of the chip region. As apparent from FIG. 3E, the surface of photoresist layer 20 is planar except above depression 18B' where a depression referenced 20B' is now formed in the photoresist layer 20.

Figure 3F:
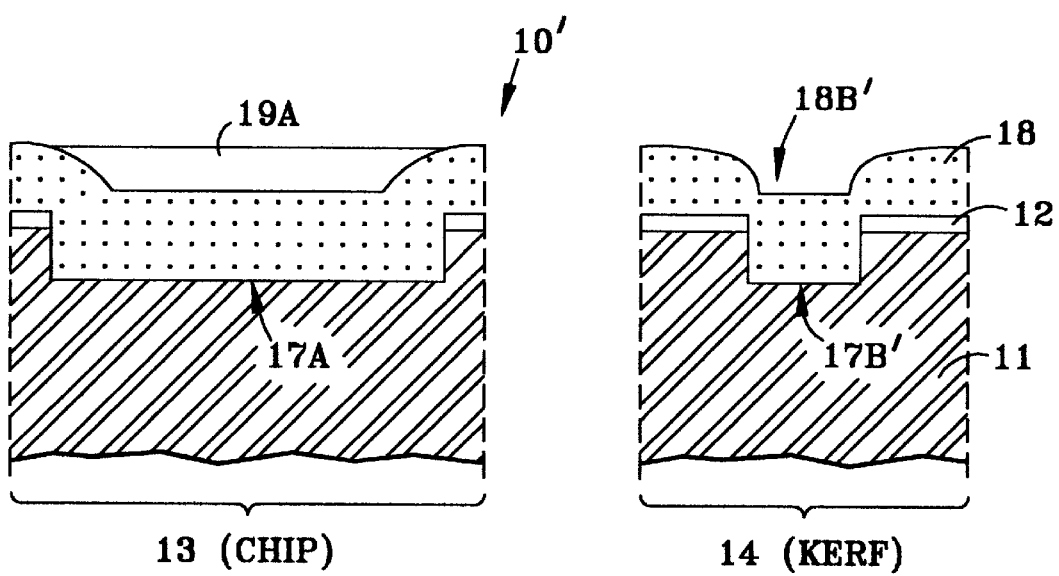
Figure 3G:
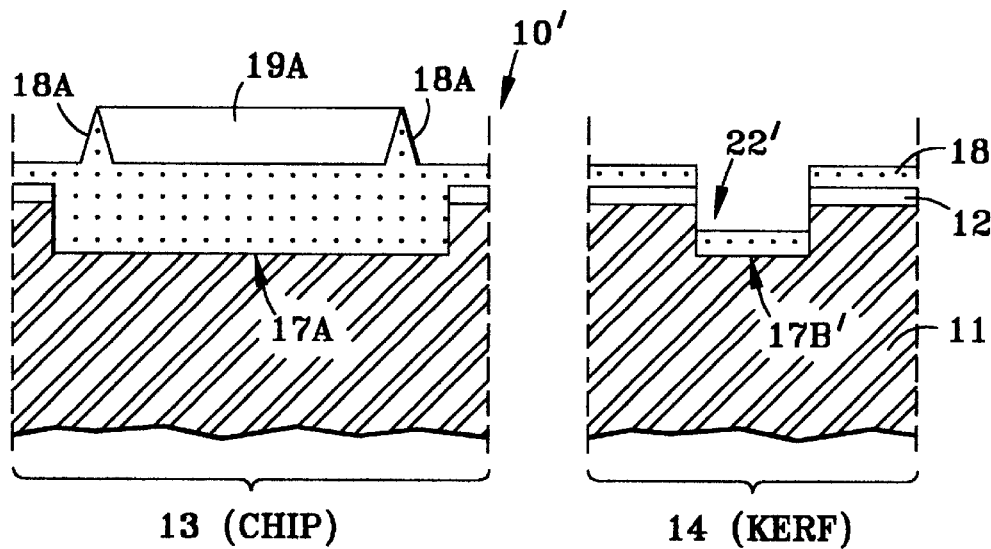
Figure 3H:
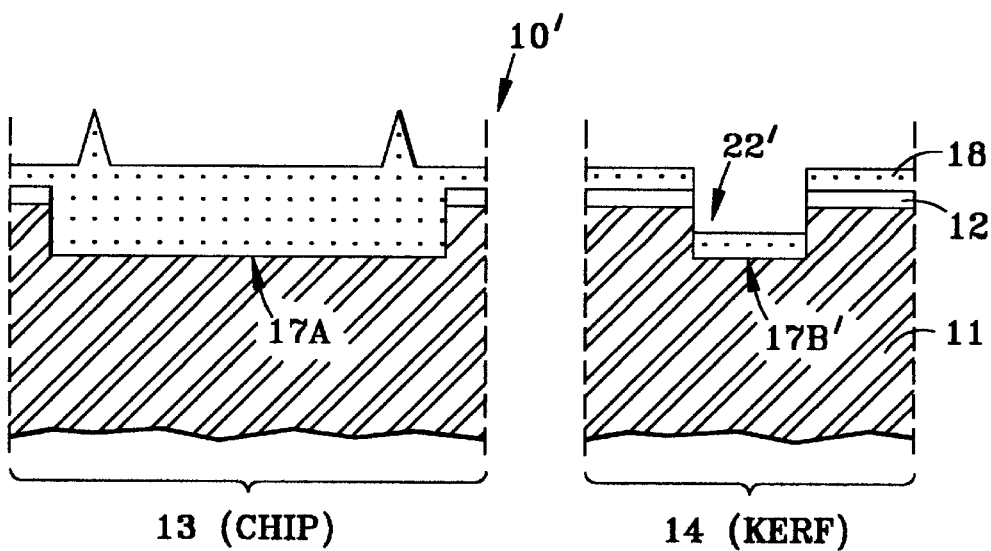

Now, the resist material of layer 20 is etched back in a RIE tool to produce the structure illustrated in FIG. 3F. The etching is continued in the same tool but with a different gas mixture so that the TEOS $SiO_2$ material of layer 18 is etched much faster than the resist material of mask 19A to produce the structure 10' of FIG. 3G. As a result, a recess 22' is formed in trench 17B'. The thickness of the TEOS $SiO_2$ layer is reduced by about 600 nm, so that there is a height difference of about 400 nm between the $Si_3N_4$ layer/silicon substrate interface and the bottom of the recess 22'. The remaining photoresist of mask 19A is stripped to produce the structure 10' shown in FIG. 3H.

Figure 3I:
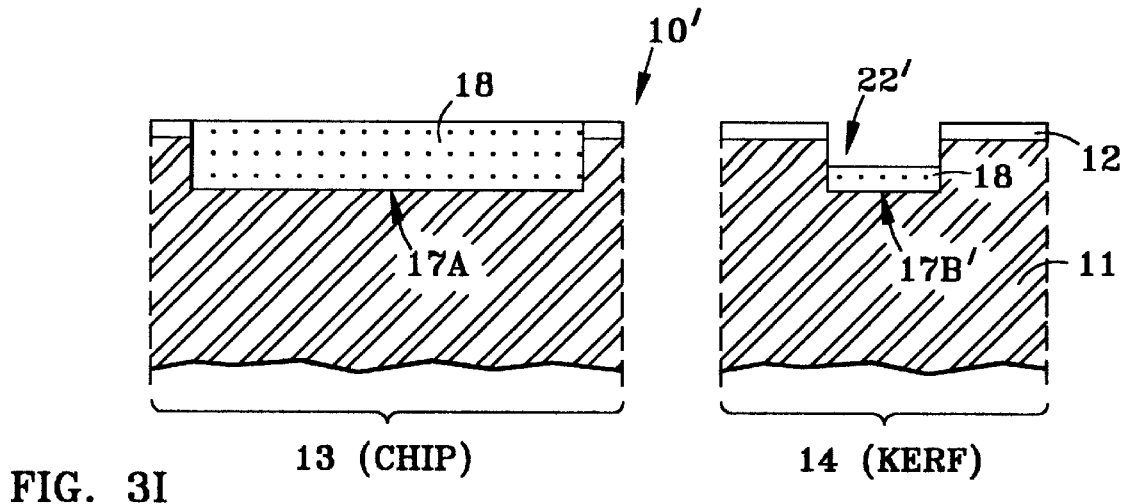

The wafer is then submitted to the chem-mech operation to produce the structure depicted in FIG. 3I. The $Si_3N_4$ pad layer 12 is used as the polish stop layer as standard. At this stage of the fabrication process, the resulting structure has a planar surface (substantially the substrate 11 surface) with all the isolation trenches (e.g. 17A) filled with the TEOS $SiO_2$ material except the alignment trenches (e.g. 17B') which exhibit recess 22'.

Figure 3J:
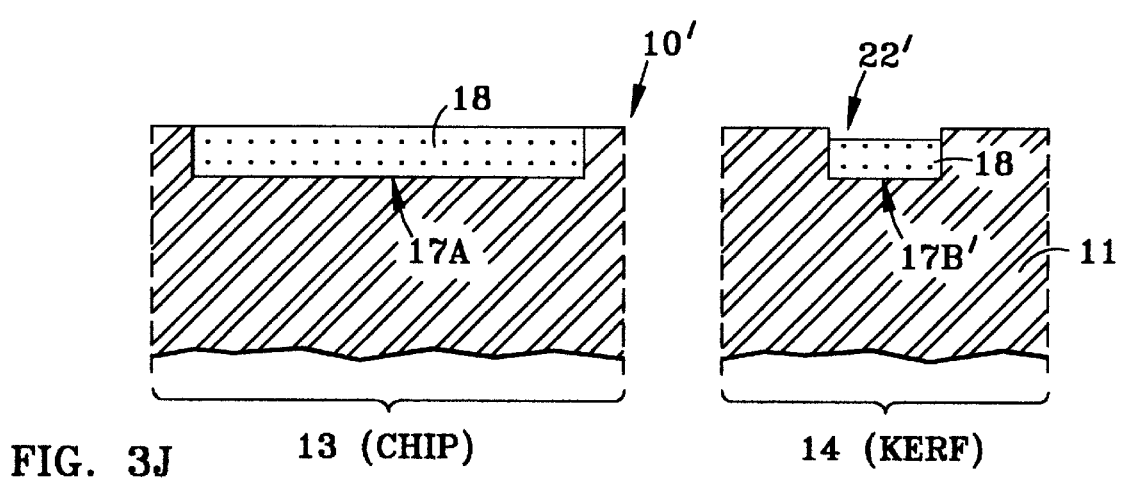

Finally, the $Si_3N_4$ pad layer 12 is eliminated as illustrated in FIG. 3J.

Recess 22' may be used as an alignment mark for any purpose, for instance, for patterning a layer of either a transparent or opaque material. Obviously, its role will be of greater importance, should an opaque layer be deposited.

Therefore, let us assume that the composite polysilicon/ WSi$_x$/TEOS SiO$_2$ layer 23 forming the gate electrode stack is now blanket deposited onto the structure 10' for sake of illustration.

Figure 3K:
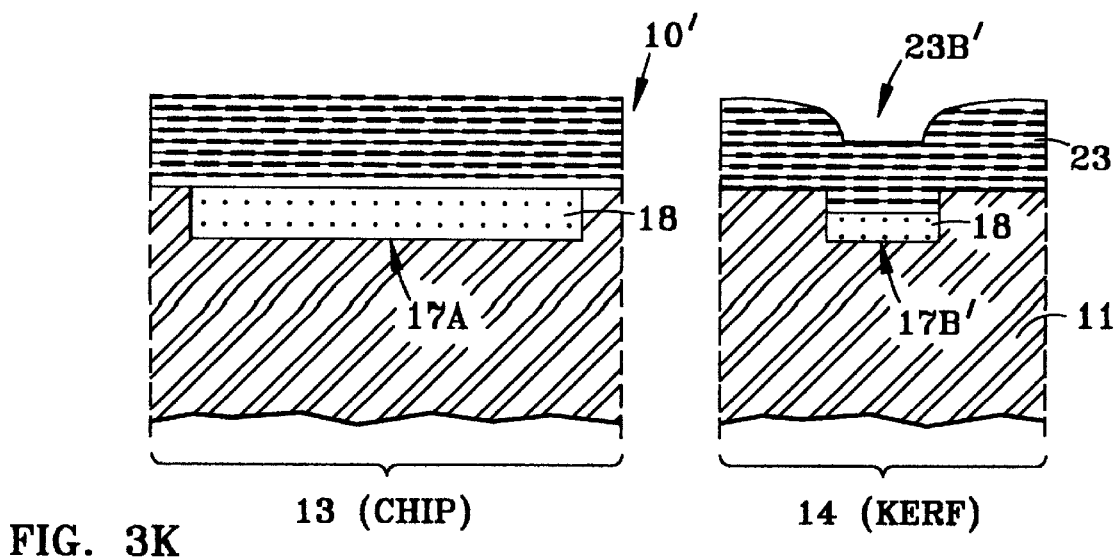

Now turning to FIG. 3K, after this deposition step has been completed, there is a depression referenced 23B' above alignment trench 17B' which will be used as the alignment mark to pattern the gate electrodes in opaque layer 23. An essential aspect of the method of the present invention is the role of the depression 18B' width in the creation of recess 22', which in turn, causes the formation of depression 23B'. In the present case, this depression 23B' exists as far as the width W' of said alignment trench is greater than a minimum value E equal to twice the sum of the thickness Th1 of the TEOS SiO$_2$ layer 18 and the thickness Th2 of the second photoresist layer 20, i.e. E=2*(Th1+Th2). Preferably, the width W' is made equal to 2*E, i.e in the present in stance W'=5600 nm. This explains why in FIG. 3B, the width W' of trench 17B' is substantially greater than the width W of trench 17B of FIG. 2B.

Other process alternatives may be envisioned between the stages illustrated by reference to FIGS. 3F and 3J.

As clear from the above described method, the alignment mark (recess 22' or depression 23B') has been achieved without requiring the specific photolithographic step of patterning the photoresist layer 21 and the step of etching the TEOS SiO$_2$ material filling alignment trench 17B to create recess 22. According to the present invention, the TEOS SiO$_2$ material in alignment trench 17B' has been naturally removed during the fabrication process only thanks to the two photomask design changes mentioned above with regards to the conventional fabrication process. It is important to remark that there is no change from a process point of view. The first design change ensures that an adequate width W' of the alignment trench will be obtained. According to the disclosed preferred embodiment, this width W' is determined as a function of the thicknesses of the TEOS SiO$_2$ layer 18 and of the top photoresist layer 20, respectively Th1 and Th2, which are known parameters from the product specifications. The second design change ensures the formation of depression 18B' in TEOS SiO$_2$ layer 18 above trench 17B', which in turn, is determining in the formation of recess 22' and finally of depression 23B' after the opaque layer 23 has been deposited.

Although the above description has been made by reference to the specific process of forming isolation trenches in a silicon substrate that are filled with an insulating material (e.g. TEOS SiO$_2$), it should be understood that the present invention also encompasses the use of other filling materials, such as metals, should conductive lands or studs be formed. Likewise, other semiconductor materials such as GaAs or SiGe can be used in lieu of silicon for the substrate.

I claim:

1. A method of forming an alignment mark in a planar semiconductor IC structure to be used in a subsequent lithographic step comprising the steps of:
   a) providing a structure comprised of a semiconductor substrate having at least one shallow trench in a first region of the substrate and at least one shallow alignment trench in a second region of the substrate;
   b) conformally depositing a layer of a filling material onto the structure adequate to overfill the shallow trenches so that respective depressions are created in said filling material above the locations of said trenches;
   c) planarizing the structure with a planarizing medium to fill the depression over the trench formed in the first region, said depression formed over said alignment trench in the second region being preserved; and,
   d) uniformly etching back the structure down to the surface of the substrate to transfer only said depression formed above the alignment trench in said filling material creating thereby a recess therein that can be used as an alignment mark for said photolithographic step.

2. The method of claim 1 further comprising the step of:
   e) conformally depositing a layer of an opaque material onto the structure, which in turn, produces a new depression above said recess formed in the alignment trench that will, in turn, be used as an alignment mark for said photolithographic step.

3. The method of claim 2 wherein said semiconductor is silicon.

4. The method of claim 1 wherein said semiconductor is silicon.

5. The method of claim 4 wherein said filling material is an insulating material.

6. The method of claim 5 wherein said insulating material is TEOS SiO$_2$.

7. The method of claim 4 wherein said filling material is a metal.

8. The method of claim 4 wherein said layer of opaque material includes a layer of tungsten silicide (WSi$_x$).

9. The method of claim 4 wherein said metal is tungsten.

* * * * *